United States Patent
Woo et al.

[11] Patent Number: 6,121,141
[45] Date of Patent: Sep. 19, 2000

[54] METHOD OF FORMING A VOID FREE COPPER INTERCONNECTS

[75] Inventors: Christy Mei-Chu Woo, Cupertino; Dirk Brown, Santa Clara; Young-Chang Joo, Sunnyvale; Imran Hashim, San Jose, all of Calif.

[73] Assignee: Advanced Micro Devices, Inc., Sunnyvale, Calif.

[21] Appl. No.: 09/198,362

[22] Filed: Nov. 24, 1998

[51] Int. Cl.[7] .................................................. H01L 21/44
[52] U.S. Cl. ............................ 438/687; 438/622; 438/660
[58] Field of Search .................... 438/687, 622, 438/660

[56] References Cited

U.S. PATENT DOCUMENTS

| | | | |
|---|---|---|---|
| 4,789,648 | 12/1988 | Chow et al. | |
| 5,252,147 | 10/1993 | Verhoeven et al. | 148/237 |
| 5,518,964 | 5/1996 | DiStefano et al. | 437/209 |
| 5,691,238 | 11/1997 | Avanzino et al. | 437/195 |
| 5,801,441 | 9/1998 | DiStephano et al. | 257/696 |
| 5,856,068 | 1/1999 | Magera et al. | 438/312 |
| 5,863,707 | 1/1999 | Lin | 430/313 |
| 5,916,823 | 6/1999 | Lou et al. | 438/738 |

*Primary Examiner*—Jey Tsai
*Assistant Examiner*—Lynne A. Gurley

[57] ABSTRACT

Void free Cu or Cu alloy interconnects are formed by annealing at superatmospheric pressure after metallization. Embodiments include filling a damascene opening in a dielectric layer with Cu or a Cu alloy and heat treating in a chamber at a pressure of about 2 atmospheres to about 750 atmospheres.

19 Claims, 3 Drawing Sheets

METHOD OF FORMING A VOID FREE COPPER INTERCONNECTS

TECHNICAL FIELD

The present invention relates to semiconductor devices comprising copper (Cu) or Cu alloy interconnection patterns. The present invention is applicable to manufacturing high speed integrated circuits having submicron design features and high conductivity interconnect structures.

BACKGROUND ART

The escalating requirements for high density and performance associated with ultra large scale integration semiconductor wiring require responsive changes in interconnection technology, which is considered one of the most demanding aspects of ultra large scale integration technology. Such escalating requirements have been found difficult to satisfy in terms of providing a low RC (resistance capacitance) interconnect pattern, particularly wherein submicron vias, contacts and trenches have high aspect ratios due to miniaturization.

Conventional semiconductor devices comprise a semiconductor substrate, normally of monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via opening, while a conductive plug filling a contact opening establishes electrical contact with an active region on a semiconductor substrate, such as a source/drain region. Conductive lines formed in trench openings typically extend substantially horizontal with respect to the semiconductor substrate. Semiconductor "chips" comprising five or more levels of metallization are becoming more prevalent as device geometries shrink to submicron levels.

A conductive plug filling a via opening is typically formed by depositing a dielectric interlayer on a conductive layer comprising at least one conductive pattern, forming an opening through the dielectric interlayer by conventional photolithographic and etching techniques, and filling the opening with a conductive material, such as tungsten (W). Excess conductive material on the surface of the dielectric interlayer can be removed by chemical-mechanical polishing (CMP). One such method is known as damascene and basically involves the formation of an opening which is filled in with a metal. Dual damascene techniques involve the formation of an opening comprising a lower contact or via opening section in communication with an upper trench opening section, which opening is filled with a conductive material, typically a metal, to simultaneously form a conductive plug in electrical contact with a conductive line. In U.S. Pat. No. 5,635,423, prior art single and dual damascene techniques are disclosed, in addition to several improved dual damascene techniques for simultaneously forming a conductive line in electrical contact with a conductive plug for greater accuracy in forming fine line patterns with minimal interwiring spacings High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. Thus, the interconnection pattern limits the speed of the integrated circuit.

If the interconnection node is routed over a considerable distance. e.g.. hundreds of microns or more, as in submicron technologies, the interconnection capacitance limits the circuit node capacitance loading and, hence, the circuit speed. As integration density increases and feature size decreases in accordance with submicron design rules. e.g.. a design rule below about $0.18\mu$, the rejection rate due to integrated circuit speed delays severely limits production throughput and significantly increases manufacturing costs.

One way to increase the control speed of semiconductor circuitry is to reduce the resistance of a conductive pattern. Conventional metallization patterns are typically formed by depositing a layer of conductive material, notably aluminum (Al) or an alloy thereof, and etching or by damascene techniques wherein trenches are formed in dielectric layers and filled with a conductive material. Excess conductive material on the surface of the dielectric layer is then removed by CMP. Al is conventionally employed because it is relatively easy to etch. However, as the size of openings for vias/contacts and trenches is scaled down to the submicron range, step coverage problems have arisen involving the use of Al which has decreased the reliability of interconnections formed between different wiring layers. Such poor step coverage results in high current density and enhanced electromigration. Moreover, low dielectric constant polyimide materials, when employed as dielectric interlayers, create moisture/bias reliability problems when in contact with Al.

One approach to improved interconnection paths in vias comprises the use of completely filled plugs of a metal, such as W. Accordingly, many current semiconductor devices utilizing VLSI (very large scale integration) technology employ Al for a wiring metal and W plugs for interconnections at different levels. However, the use W is attendant with several disadvantages. For example, most W processes are complex and expensive. Moreover, W has a high resistivity. The Joule heating may enhance electromigration of adjacent Al wiring. Furthermore, W plugs are susceptible to void formation and the interface with the wiring layer usually results in high contact resistance.

Another attempted solution for the Al plug interconnect problem comprises the use of chemical vapor deposition (CVD) or physical vapor deposition (PVD) at elevated temperatures for Al deposition. The use of CVD for depositing Al has proven expensive, while hot PVD Al deposition requires very high process temperatures incompatible with manufacturing integrated circuitry.

Cu and Cu alloys have recently received considerable attention as a replacement material for Al in VLSI interconnection metallizations. Cu has a lower resistivity than Al, and has improved electrical properties vis-a-vis W, making Cu a desirable metal for use as a conductive plug as well as conductive wiring. However, it is difficult to form void free Cu or Cu alloy interconnects with high electromigration resistance. There are additional disadvantages attended upon the use of Cu or Cu alloys. For example, Cu is easily oxidized and vulnerable to corrosion.

One conventional approach in attempting to form Cu plugs and wiring comprises the use of damascene structures employing CMP, as in Chow et al., U.S. Pat. No. 4,789,648.

However, due to Cu diffusion through the dielectric interlayer, Cu interconnect structures must be encapsulated by a diffusion barrier layer. Typical diffusion barrier metals include tantalum (Ta), tantalum nitride (TaN), titanium (Ti), titanium nitride (TiN), titanium tungsten (TiW), and silicon nitride ($Si_3N_4$) for encapsulating Cu. The use of such barrier materials to encapsulate Cu is not limited to the interface between Cu and the dielectric interlayer, but includes interfaces with other metals as well.

The difficulty of forming voidless interconnects is particular acute in damascene technology. For example, adverting to FIG. 1, an opening in dielectric layer 10 is filled with copper 11 to form a via/contact 11. The damascene opening can be filled by physical vapor deposition (PVD), chemical vapor deposition (CVD), electroplating or electroless plating. Although not depicted for illustrative convenience, a barrier layer is typically formed in the opening prior to Cu metallization. Via 11 forms an electrical interconnection with underlying metal feature 12. In the case of contact 11, the underlying feature would be a source/drain region on a semiconductor substrate. As shown in FIG. 1, a void 13 is typically formed in via/contact 11. A conventional approach to this problem comprises heat treating at atmospheric pressure in a furnace or chamber at a temperature of about 80° C. to about 400° C. Such heat treatment is performed to alter the grain size and orientation of the Cu metallization to anneal out voids due to crystal growth and, hence, improve electromigration resistance.

It was, however, found that voids 14 would form at the sides of the opening, as shown in FIG. 2. It is believed that such voids 14 occur as a result of the migration of Cu atoms to fill the void 13 (FIG. 1), proximate the center of the via/contact 11. Accordingly, there exists a need for void free Cu metallization technology. There exists a particular need for methodology to implement void free Cu or Cu alloy damascene interconnect patterns.

DISCLOSURE OF THE INVENTION

An advantage of the present invention is a method of manufacturing a semiconductor device having a reliable, void free Cu or Cu alloy interconnection pattern.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising depositing a Cu or Cu alloy; and heat treating the deposited Cu or Cu alloy while applying a pressure above superatmospheric pressure. Embodiments include forming a damascene opening in a dielectric layer and heat treating in a chamber at about 2 to about 30 atmospheres.

Additional advantages of the present invention will become readily apparent to those skilled in this art from the following detailed description, wherein embodiments of the present invention are described simply by way of illustrating the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature and not as restrictive.

DESCRIPTION OF THE INVENTION

The present invention addresses and solves the formation of voids attendant upon Cu or Cu metallization, particularly when filling damascene openings, in a cost effective and efficient manner, thereby improving electromigration resistance. Accordingly, the present invention enables the use of Cu metallization in forming reliable interconnect patterns in submicron devices, e.g., semiconductor devices having a design rule of about $0.18\mu$ and under. As employed throughout this application, the symbol Cu is intended to encompass high purity elemental copper as well as copper-based alloys, such as copper alloys containing minor amounts of tin, zinc, maganese, titanium and germanium, consistent with the requirements of interconnections in semiconductor devices.

In accordance with embodiments of the present invention, annealing is conducted subsequent to Cu metallization, as in a chamber or furnace, as at a temperature about 80° C. to about 400° C. However, such annealing is not conducted at atmosphere pressure. Rather, in accordance with the embodiments of the present invention, Cu metallization annealing is conducted at superatmospheric pressure. Annealing at superatmospheric pressure would eliminate or substantially eliminate the formation of voids.

Figure 1:
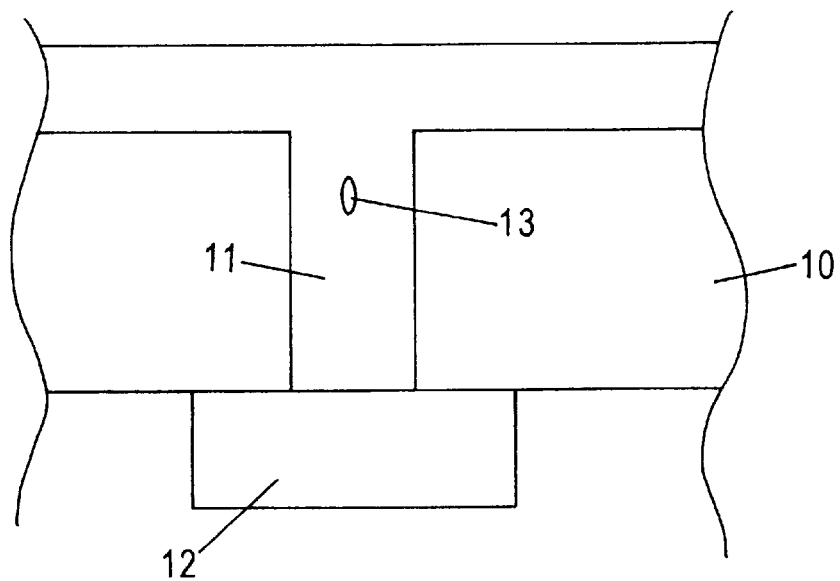
FIGS. 1 and 2 schematically illustrates sequential phases of a conventional method of forming a copper via.
Figure 2:
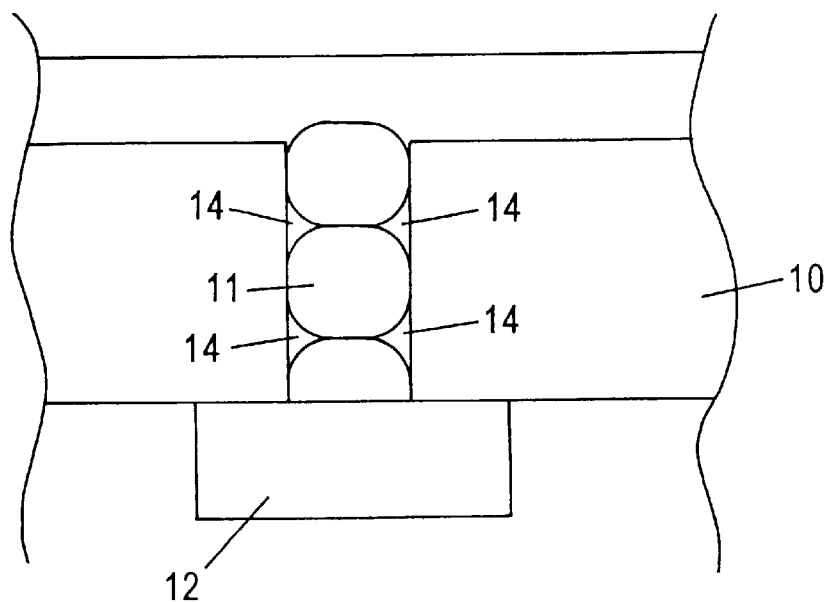
Figure 3:
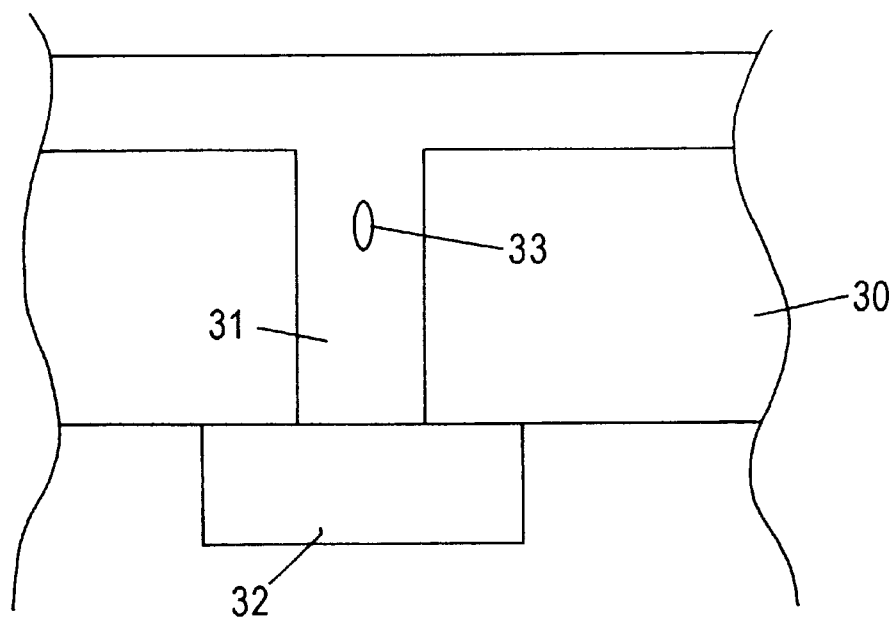
FIGS. 3–5 schematically illustrated sequential phases of an embodiment in accordance with the present invention.
Figure 4:
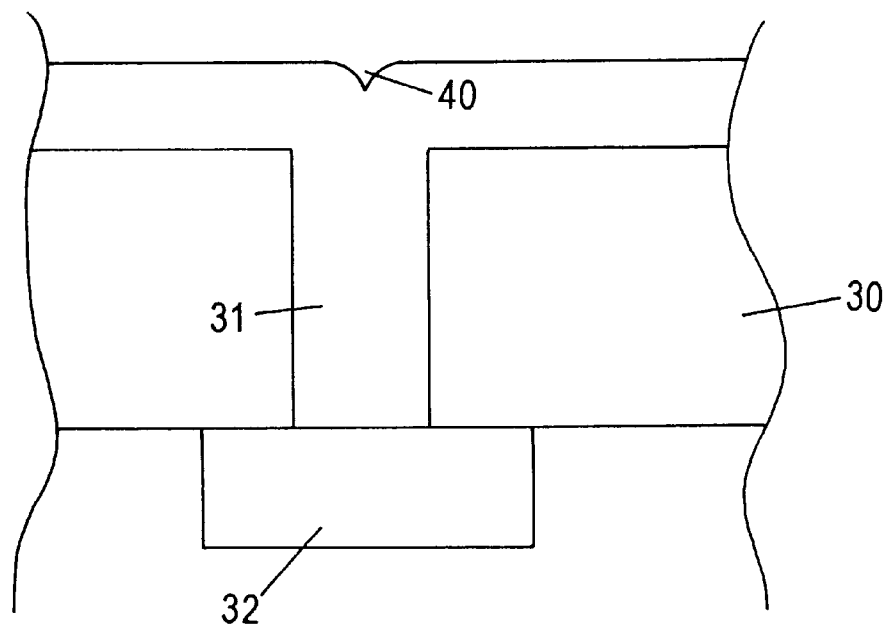
Figure 5:
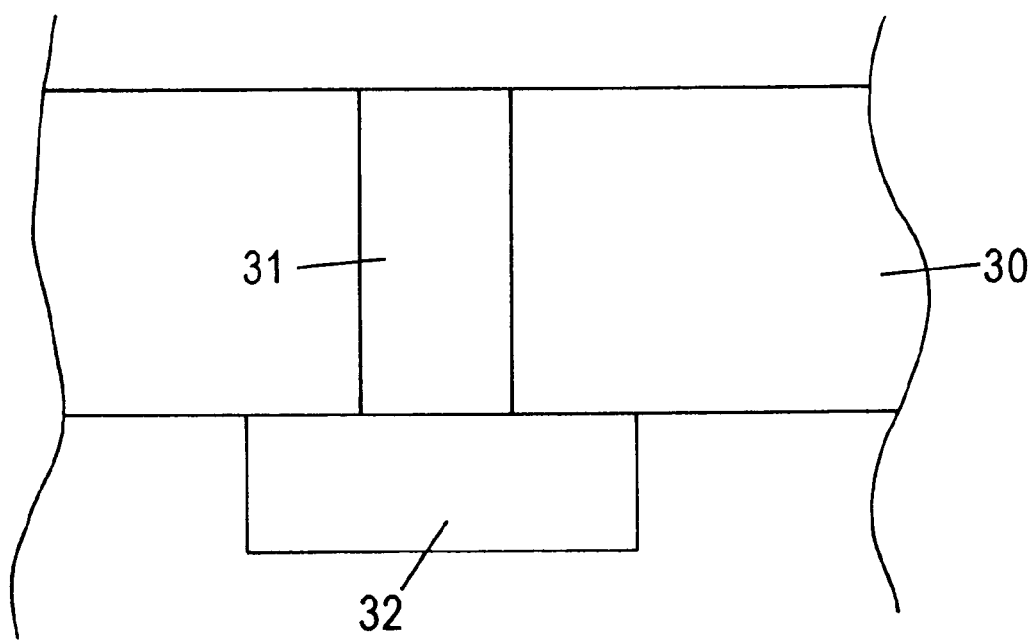

For example, adverting to FIG. 3, a damascene via opening in a dielectric layer 30 is filled with copper 31, as by CVD, PVD, electroplating or electroless plating. A void 33 is formed within via 31. Although not depicted for illustrated for illustrative convenience, a conventional barrier layer is initially deposited to prevent diffusion of copper atoms, such as Ta, TaN, Ti, TiN, TiW or $Si_3N_4$. Via 31 is electrically connected to underlying conductive feature 32. Subsequent to Cu metallization, the substrate is placed in a furnace or chamber and heated to an elevated temperature, as at about 80° C. to about 400° C. at superatmospheric pressure, whereby void 33 (FIG. 3) is eliminated as depicted in FIG. 4. As a result of applying superatmospheric pressure, a slight depression 40 is formed at the upper surface of the Cu metallization. However, such a depression 40 has virtually no impact on the ultimate device or processing in that depression 40 is removed during subsequent planarization, as by chemical mechanical polishing, as illustrated in FIG. 5.

Accordingly, the present invention enables the formation of void free Cu interconnect patterns, including interconnect patterns formed by damascene technology such as single and dual damascene openings. In filling such damascene openings in accordance with the present invention, a conventional barrier layer is deposited to prevent Cu migration. In filling damascene openings by electroplating or electroless plating, a seedlayer is deposited on the barrier layer, as in conventional practices.

In practicing embodiments of the present invention by annealing Cu metallization at superatmospheric pressure, the effective pressure can be determined in a particular situation depending upon such factors as the geometry involved. For example, it was found suitable to employ a pressure of about 2 atmospheres to about 750 atmospheres, such as about 2 atmospheres to about 250 atmospheres when filling damascene openings for a design rule of about $0.18\mu$, e.g. an opening having a width of about 0.2μ to about 0.3μ. Suitable pressures include about 2 atmospheres to about 30 atmospheres and about 2 atmospheres to about 5 atmospheres In filling damascene openings, it is desirable to apply the pressure from above the Cu metallization, thereby effectively removing voids in the filled damascene openings resulting a slight depression 40 (FIG. 4) on the upper surface of the Cu metallization. Advantageously, annealing and pressure application can be conducted in a conventional high pressure tool, such as Force Fill manufactured by Tricon Technologies, located in Newport, South Wales, United Kingdom, which is conventionally employed to force aluminum into damascene openings.

The present invention provides cost effective, efficient methodology to form reliable, void free Cu or Cu interconnect patterns with improved electromigration resistance. The present invention can be employed in manufacturing any of various types of semiconductor devices, particularly semiconductor devices having a design rule of about 0.18μ and under.

In the previous description, numerous specific details are set forth, such as specific materials, structures, chemicals, processes, etc., in order to provide a better understanding of the present invention. However, the present invention can be practiced without resorting to the details specifically set forth. In other instances, well known processing structures have not been described in order to unnecessarily obscure the present invention.

Only the preferred embodiment of the present invention and but a few examples of its versatility are shown and described in the present disclosure. It is to be understood that the present invention is capable of use in various other combination and environments and is capable of chances and modifications within the scope of the inventive concept as expressed herein.

What is claimed is:

1. A method of forming a copper (Cu) or Cu alloy interconnection of an integrated circuit in a semiconductor device comprising a semiconductor substrate with an active region and a plurality of sequentially formed dielectric layers and conductive patterns, the interconnection electrically connecting conductive patterns on different layers or establishing electrical contact with the active region on the semiconductor substrate, the method comprising:

depositing Cu or Cu alloy; and heat treating the deposited Cu or Cu alloy while applying a pressure above atmospheric pressure.

2. The method according to claim 1, comprising depositing the Cu or Cu alloy layer in an opening formed in a dielectric layer.

3. The method according to claim 2, comprising heat treating in a chamber at a pressure of greater than about 2 atmosphere to about 750 atmospheres.

4. The method according to claim 3, comprising heat treating in a chamber at a pressure of about 2 atmospheres to about 30 atmospheres.

5. The method according to claim 4, comprising heat treating in a chamber at a pressure of about 2 atmospheres to about 5 atmospheres.

6. The method according to claim 2, further comprising planarizing the deposited Cu or Cu alloy.

7. The method according to claim 6, comprising planarizing by chemical mechanical polishing.

8. The method according to claim 2, comprising heat treating in an inert atmosphere.

9. The method according to claim 2, comprising heat treating at a temperature of about 80° C. to 400° C.

10. The method according to claim 2, comprising depositing the Cu or Cu alloy by physical vapor deposition, chemical vapor deposition, electroplating or electroless plating.

11. The method according to claim 2, comprising depositing a barrier layer in the opening before depositing the Cu or Cu alloy layer.

12. A method of manufacturing a semiconductor device, the method comprising:

depositing a copper (Cu) or a Cu alloy to fill an opening formed in a dielectric layer such that the deposited Cu or Cu alloy extends above the opening;

heat treating the deposited Cu or Cu alloy while applying a pressure above atmospheric pressure; and planarizing the deposited Cu or Cu alloy.

13. The method according to claim 12, comprising heat treating in a chamber at a pressure of greater than about 2 atmosphere to about 750 atmospheres.

14. The method according to claim 13, comprising heat treating in a chamber at a pressure of about 2 atmospheres to about 30 atmospheres.

15. The method according to claim 14, comprising heat treating in a chamber at a pressure of about 2 atmospheres to about 5 atmospheres.

16. The method according to claim 12, comprising planarizing by chemical mechanical polishing.

17. The method according to claim 12, comprising heat treating in an inert atmosphere.

18. The method according to claim 12, comprising heat treating at a temperature of about 80° C. to 400° C.

19. The method according to claim 12, comprising depositing a barrier layer in the opening before depositing the Cu or Cu alloy layer.

* * * * *